(12) United States Patent
Rho

(10) Patent No.: US 7,498,844 B2
(45) Date of Patent: Mar. 3, 2009

(54) OUTPUT DRIVER FOR DYNAMIC RANDOM ACCESS MEMORY

(75) Inventor: Kwang-Myoung Rho, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 127 days.

(21) Appl. No.: 11/477,482

(22) Filed: Jun. 30, 2006

(65) Prior Publication Data

US 2007/0126477 A1 Jun. 7, 2007

(30) Foreign Application Priority Data

Sep. 29, 2005 (KR) .................. 10-2005-0091552
Dec. 15, 2005 (KR) .................. 10-2005-0123978

(51) Int. Cl.
*H03K 19/0175* (2006.01)
*H03K 5/12* (2006.01)

(52) U.S. Cl. ................... 326/86; 326/33; 327/170

(58) Field of Classification Search ............ 326/82–83, 326/86, 31–34; 327/108, 109, 170
See application file for complete search history.

(56) References Cited

U.S. PATENT DOCUMENTS

| 5,568,081 | A | * | 10/1996 | Lui et al. ............ 327/380 |
| 6,047,346 | A | | 4/2000 | Lau et al. |
| 6,281,730 | B1 | | 8/2001 | Vu |
| 6,504,396 | B2 | | 1/2003 | Sher et al. |
| 6,646,483 | B2 | | 11/2003 | Shin |
| 7,109,768 | B2 | * | 9/2006 | Rashid ............ 327/170 |
| 2005/0105294 | A1 | | 5/2005 | Cho et al. |
| 2005/0195005 | A1 | * | 9/2005 | Choi et al. ............ 327/170 |

FOREIGN PATENT DOCUMENTS

| JP | 2003-179480 A | 6/2003 |
| KR | 10-2003-0079297 A | 10/2003 |
| KR | 10-2005-0088862 A | 9/2005 |

OTHER PUBLICATIONS

Korean Office Action, with English Translation, issued in corresponding Korean Patent Application No. KR 10-2005-0123978, dated on Jul. 25, 2007.

* cited by examiner

*Primary Examiner*—James H Cho
(74) *Attorney, Agent, or Firm*—McDermott Will & Emery LLP

(57) ABSTRACT

An output driver includes a pre-pull up drive unit configured to perform a pre-pull up drive operation; a pre-pull down drive unit configured to perform a pre-pull down drive operation; a drive unit configured to perform a drive operation in response to outputs of the pre-pull up drive unit and the pre-pull down drive unit; and a compensation unit configured to sense changes of driving strengths of the pre-pull up drive unit and the pre-pull down drive unit to control the driving forces of the pre-pull up drive unit and the pre-pull down drive unit.

30 Claims, 5 Drawing Sheets

OUTPUT DRIVER FOR DYNAMIC RANDOM ACCESS MEMORY

FIELD OF THE INVENTION

The present invention relates to an output driver; and, more particularly, to an output driver for outputting an output signal of stable level.

DESCRIPTION OF RELATED ARTS

As the driving strength of an output driver included in a dynamic random access memory (DRAM) increases, a data transmission speed between the DRAM and a system connected to the DRAM becomes faster. In order to insure a high speed data transmission, it is required that a slew rate of the output driver is greater than a predetermined minimum value without regarding changes of process, voltage, and temperature. If the slew rate of the output driver is excessively large, current consumption of the output driver is abruptly increased. Further, when the slew rate is excessively large, reflection caused by imperfect termination between the DRAM and the system is also increased. Therefore, an output signal has unstable value. For this reason, the slew rate of the output driver needs to be less than a predetermined maximum value. In other words, it is required that the slew rate of the output driver maintains a value ranged between the minimum value and the maximum valued even when surrounding conditions such as process, voltage, and temperature changes in order to output a stable output signal.

FIG. 1 is a block diagram of a conventional output driver.

As shown, the output driver includes a pre-pull up drive unit 20 for performing a pre-pull up drive operation in response to a pre-pull up drive signal pre_UP, a pre-pull down drive unit 30 for performing a pre-pull down drive operation in response to a pre-pull down drive signal pre_DNb, and a drive unit 10 for driving an output signal in response outputs of the pre-pull up drive unit 20 and the pre-pull down drive unit 30.

The drive unit 10 includes a first PMOS transistor PM1, a first NMOS transistor NM1, and a first and a second resistor R1 and R2. The first PMOS transistor PM1, connected between a power supply voltage VDDQ terminal and the first resistor R1, receives the output of the pre-pull up drive unit 20 at its gate. The first resistor R1 is connected between the first PMOS transistor PM1 and an output node A. The first NMOS transistor NM1, connected between a ground voltage VSSQ terminal and the second resistor R2, receives the output of the pre-pull down drive unit 30 at its gate. The second resistor R2 is connected between the first NMOS transistor NM1 and the output node A.

The pre-pull up drive unit 20 includes a second PMOS transistor PM2, a second NMOS transistor NM2, and a third resistor R3. The second PMOS transistor PM2, connected between the power supply voltage VDDQ terminal and an output node B, receives the pre-pull up drive signal pre_UP at its gate. The second NMOS transistor NM2, connected between the third resistor R3 and the ground voltage VSSQ terminal, receives the pre-pull up drive signal pre_UP at its gate. The third resistor R3 is connected between the second NMOS transistor NM2 and the output terminal B.

The pre-pull down drive unit 30 includes a third PMOS transistor PM3, a third NMOS transistor NM3, and a fourth resistor R4. The third PMOS transistor PM3, connected between the power supply voltage VDDQ terminal and the fourth resistor R4, receives the pre-pull down drive signal pre_DNb at its gate. The third NMOS transistor NM3, connected between an output node C and the ground voltage VSSQ terminal, receives the pre-pull down drive signal pre_DNb at its gate. The fourth resistor R4 is configured between the third PMOS transistor PM3 and the output terminal C.

As above described, the output driver shown in FIG. 1 includes passive elements, i.e., the resistors R1 to R4, between the MOS transistors PM1, NM1, NM2, and PM3 and the output nodes A, B, and C in order to reduce variation of slew rate of the output driver. It is well known that passive elements such as resistors are less influenced by the changes of process, voltage, and temperature than active elements such as a MOS transistor. Therefore, by including the passive elements, e.g., the resistors R1 to R4, the variation of the slew rate of the output driver can be somewhat reduced. In this case, the slew rate of the output driver is decreased because of the resistors R1 to R4. The decrease of the slew rate can be compensated by increasing size of the NMOS transistors.

Though it is possible to reduce the variation of the slew rate of the output driver by configuring passive elements between the MOS transistors and the output nodes, the slew rate of the output driver still changes according to process, voltage, and temperature.

SUMMARY OF THE INVENTION

It is, therefore, an object of the present invention to provide an output driver outputting an output signal of stable level.

In accordance with an aspect of the present invention, there is provided an output driver including: a pre-pull up drive unit configured to perform a pre-pull up drive operation in response to a pre-pull up drive signal; a pre-pull down drive unit configured to perform a pre-pull down drive operation in response to a pre-pull down driver signal; a drive unit configured to perform a drive operation in response to outputs of the pre-pull up drive unit and the pre-pull down drive unit; and a slew rate compensation unit configured to sense changes of a slew rate of the drive unit to thereby control the pre-pull up drive unit and the pre-pull down drive unit. Driving strengths of the pre-pull up drive unit and the pre-pull down drive unit are adjustable.

In accordance with another aspect of the present invention, there is provided an output driver including: a slew rate compensation unit configured to sense a variation of a slew rate of the output driver to thereby generate a plurality of slew rate compensation signals; a pre-pull up drive unit configured to perform a pre-pull up operation in response to the plurality of the slew rate compensation signals; a pre-pull down drive unit configured to perform a pre-pull down operation in response to the plurality of the slew rate compensation signals; and a drive unit configured to drive an output signal in response to outputs of the pre-pull up drive unit and the pre-pull down drive unit.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an output driver for use in a semiconductor memory device in accordance with the present invention will be described in detail referring to the accompanying drawings.

Figure 1:
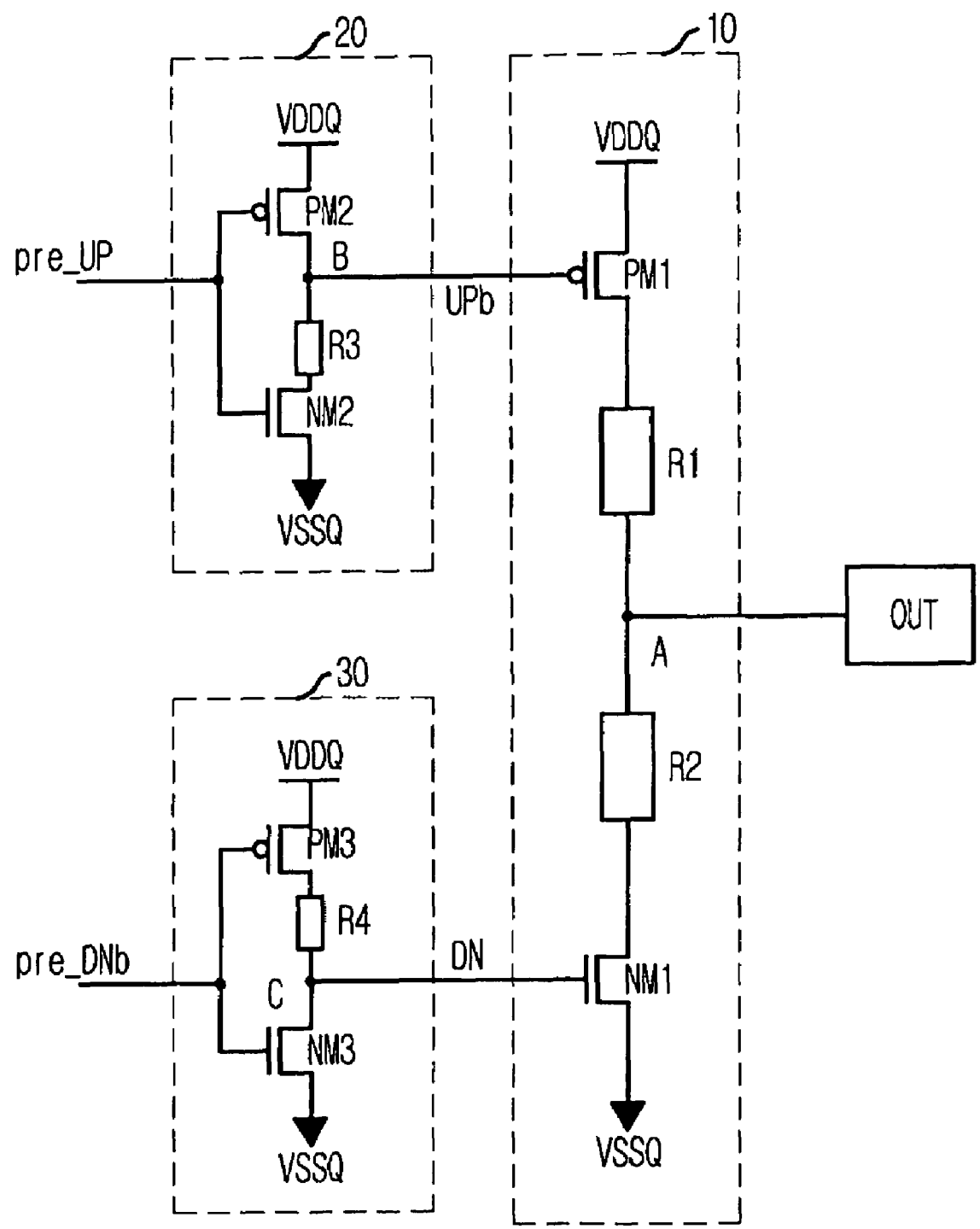
FIG. 1 is a block diagram of a conventional output driver.
Figure 2:
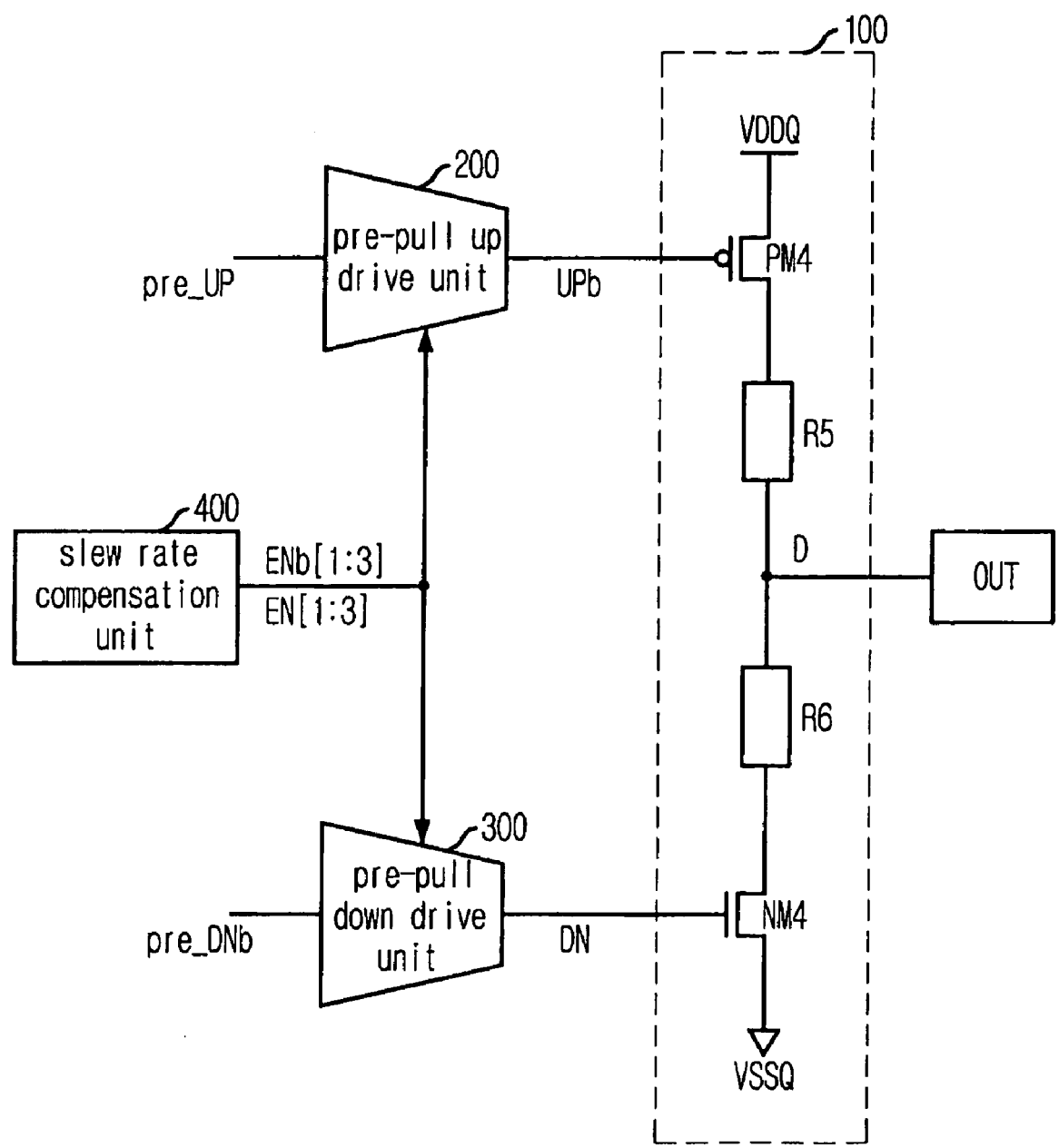
FIG. 2 is a block diagram of an output driver in accordance with an embodiment of the present invention.

FIG. 2 is a block diagram of an output driver in accordance with an embodiment of the present invention.

As shown, the output driver includes a drive unit 100, a pre-pull up drive unit 200, a pre-pull down drive unit 300, and a slew rate compensation unit 400. The slew rate compensation unit 400 senses the surrounding conditions, e.g., process, voltage, and temperature, and generates a slew rate compensation signal EN[1:3] and ENb[1:3]. The pre-pull up drive unit 200 performs a pre-pull up drive operation in response to a pre-pull up drive signal pre_UP under control of the slew rate compensation signal EN[1:3] and ENb[1:3]. The pre-pull down drive unit 300 performs a pre-pull down drive operation in response to a pre-pull down drive signal pre_DNb under control of the slew rate compensation signal EN[1:3] and ENb[1:3]. The drive unit 100 drives an output signal in response to a pull up drive signal UPb and a pull down drive signal DN respectively output from the pre-pull up drive unit 200 and the pre-pull down drive unit 300. As above mentioned, the driving strength of the pre-pull up drive unit 200 and the pre-pull down drive unit 300 are controlled by the slew rate compensation signal EN[1:3] and ENb[1:3] according to surrounding conditions.

The drive unit 100 includes a fourth PMOS transistor PM4, a fourth NMOS transistor NM4, and a fifth and a sixth resistor R5 and R6. The fourth PMOS transistor PM4, connected between a power supply voltage VDDQ terminal and the fifth resistor R5, receives the pull up drive signal UPb at its gate. The fifth resistor R5 is connected between the fourth PMOS transistor PM4 and an output node D. The fourth NMOS transistor NM4, connected between a ground voltage VSSQ terminal and the sixth resistor R6, receives the pull down drive signal DN at its gate. The sixth resistor R6 is connected between the fourth NMOS transistor NM4 and the output node D.

Figure 3:
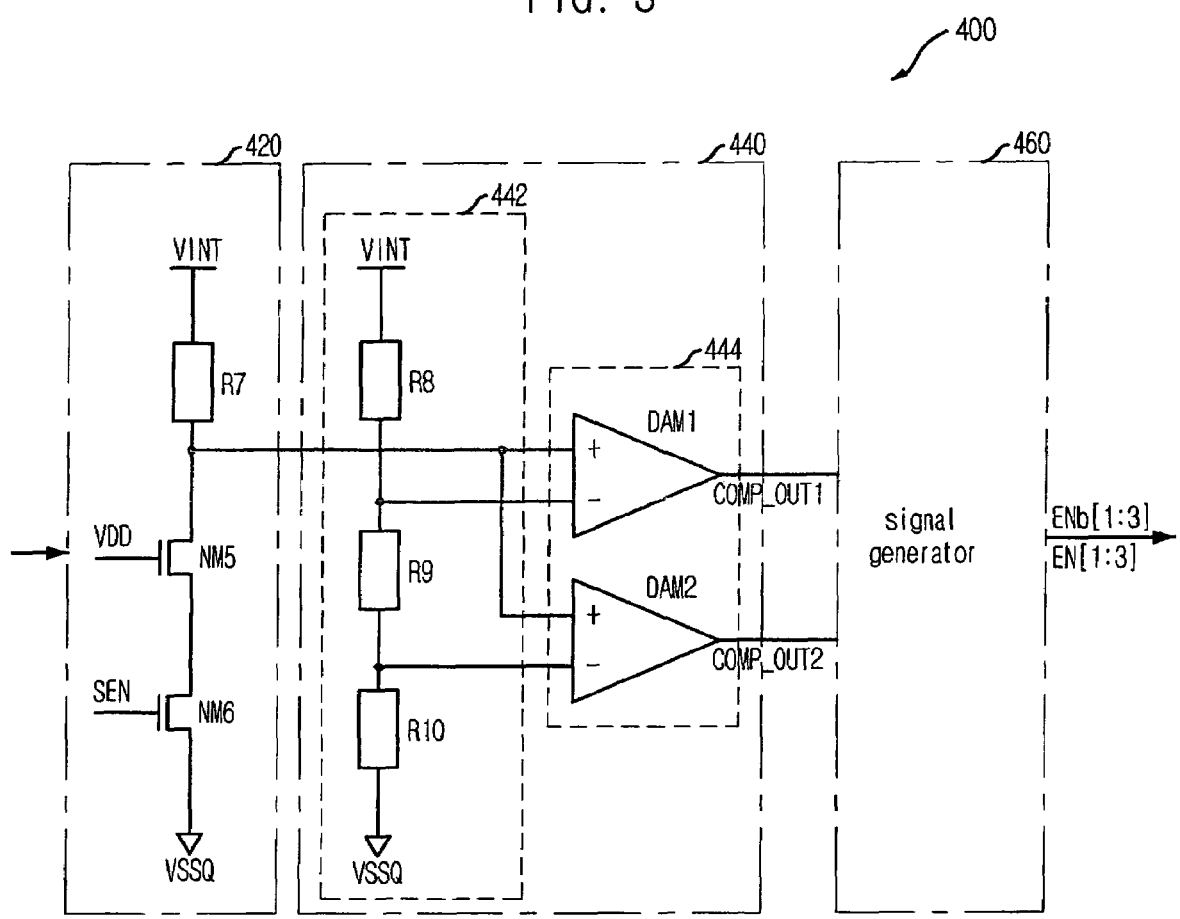
FIG. 3 is a schematic circuit diagram of a slew rate compensation unit shown in FIG. 2.

FIG. 3 is a schematic circuit diagram depicting the slew rate compensation unit 400 shown in FIG. 2.

As shown, the slew rate compensation unit 400 includes a slew rate sensing unit 420, a digitalization unit 440, and a signal generation unit 460. The slew rate sensing unit 420 includes a MOS transistor configuration that is the same as those configurations as the pre-pull up drive unit 200 and the pre-pull down drive unit 300, and senses variation of slew rate of the MOS transistor according to changes of process, voltage, and temperature. The digitalization unit 440 divides an output of the slew rate sensing unit 420. The signal generation unit 460, which receives outputs of the digitalization unit 440, outputs the slew rate compensation signal EN[1:3] and ENb [1:3].

The slew rate sensing unit 420 is implemented with a plurality of transistors connected between an internal voltage VINT terminal and the ground voltage VSSQ terminal in series. One of the transistors is an MOS transistor that is the same as those configured in the pre-pull up drive unit 200 and the pre-pull down drive unit 300. The slew rate sensing unit 420 shown in FIG. 3 includes a seventh resistor R7, a fifth and a sixth NMOS transistor NM5 and NM6 connected in series. The seventh resistor R7 is connected between the internal voltage VINT terminal and an output node. The fifth NMOS transistor NM5, which receives an external power supply voltage VDD at its gate, is connected between the output node and the sixth NMOS transistor NM6. The sixth NMOS transistor NM6, which receives a sense signal SEN at its gate, is connected between the fifth NMOS transistor NM5 and the ground voltage VSSQ terminal. The fifth NMOS transistor NM5 is the same as the NMOS transistors included in the configured in the pre-pull up drive unit 200 and the pre-pull down drive unit 300.

An internal voltage VINT, supplied to the slew rate sensing unit 420, maintains a predetermined stable level. Therefore, the slew rate sensing unit 420 can reliably sense a level of the external power supply voltage VDD without being affected by the surrounding conditions, e.g., process, voltage, and temperature. The sense signal SEN enables the slew rate sensing unit 420 only when attains an appropriate threshold level, in order to save current consumption by the slew rate sensing unit 420.

The digitalization unit 440 includes a reference voltage generator 442 and a comparing unit 444. The reference voltage generator 442 outputs a plurality of reference voltages. The comparing unit 444 compares each of the reference voltages and the output of the slew rate sensing unit 420. The reference voltage generator 442 includes a plurality of resistors R8, R9, and R10 connected between the internal voltage VINT terminal and the ground voltage VSSQ terminal in series. The comparing unit 444 includes a plurality of differential amplifiers DAM1 and DAM2. Each differential amplifier receives one of the reference voltages and the output of the slew rate sensing unit 420.

The signal generation unit 460 outputs the slew rate compensation signal EN[1:3] and ENb[1:3] in response to a plurality of output signals of the digitalization unit 440. The signal generation unit 460 can be implemented with general logic blocks and latches.

The slew rate compensation unit 400 can sense changes of slew rate of the pre-pull up drive unit 200 and the pre-pull down drive unit 300 by through the fifth NMOS transistor NM5. When a level of the external power supply voltage VDD is low and a driving strength of the MOS transistor is small, the number of enabled slew rate compensation signals EN[1:3] and ENb[1:3] is increased. On the contrary, when the level of the external power supply voltage VDD is high and the driving strength of the MOS transistor is great, the number of enabled slew rate compensation signals EN[1:3] and ENb [1:3] is decreased. In addition, the number of resistors and comparators in the digitalization unit 440 can be varied according to desired sensitivity of the slew rate compensation unit 400.

Figure 4:
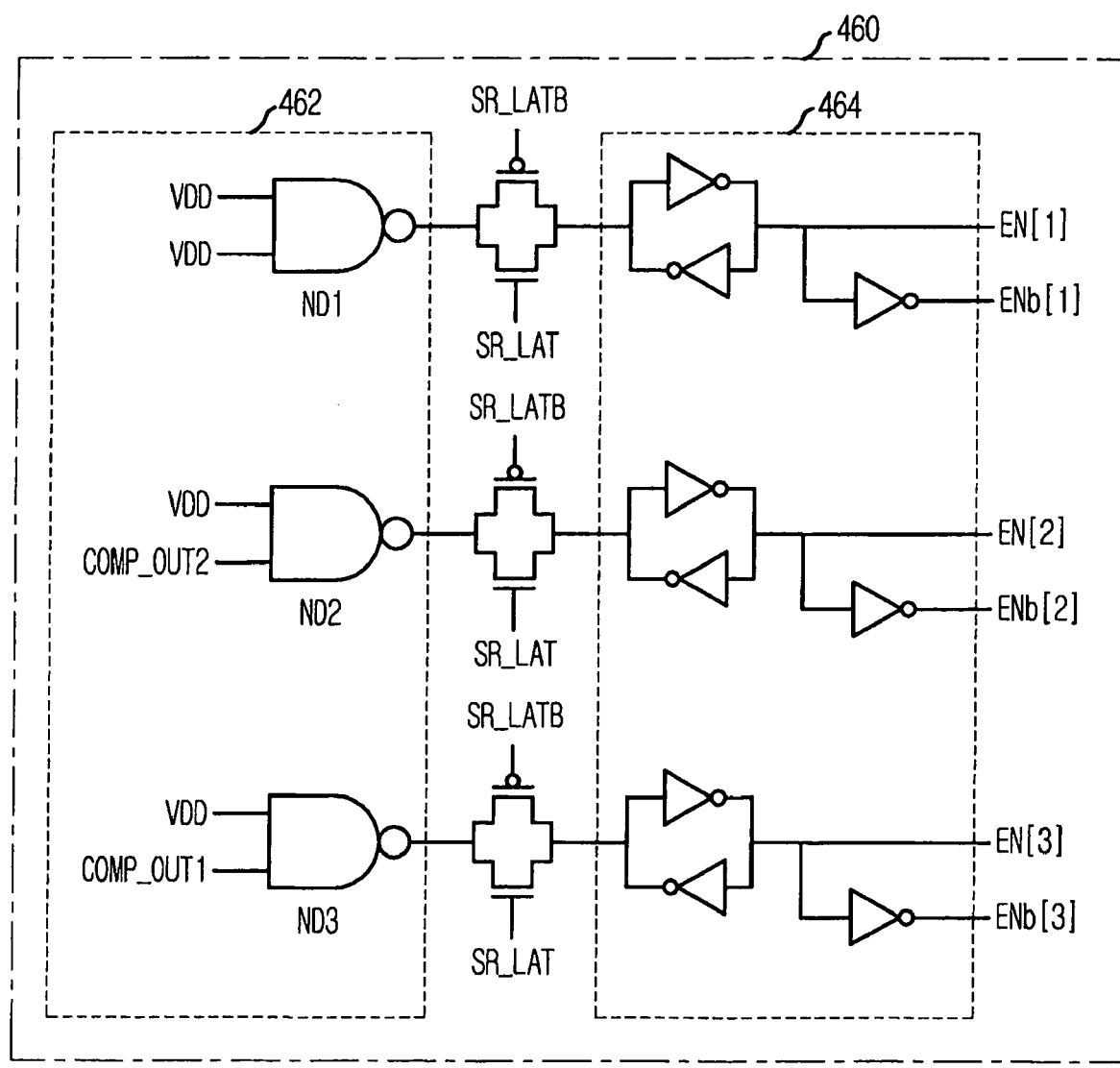
FIG. 4 is a schematic circuit diagram of a signal generation unit in accordance with an embodiment of the present invention.

FIG. 4 is a schematic circuit diagram depicting the signal generation unit in accordance with an embodiment of the present invention.

The signal generation unit 460 includes a logic unit 462, a latch unit 464, and a plurality of transmission gates TG1, TG2, and TG3. The logic unit 462 logically combines the outputs COMP_OUT1 and COMP_OUT2 of the digitalization unit 440 with the external power supply voltage VDD and outputs a plurality of logic signals. The latch unit 464 latches the logic signals and outputs the slew rate compensation signal EN[1:3] and ENb[1:3]. Each of the plurality of transmission gates TG1, TG2, and TG3 transmits the corresponding logic signal in response to a slew rate control signal pair SR_LAT and SR_LATB.

The signal generation unit 460 receives two outputs COMP_OUT1 and COMP_OUT2 and outputs three pairs of slew rate compensation signals EN[1:3] and ENb[1:3]. The logic unit 462 includes three NAND gates ND1, ND2, and ND3. The first NAND gate ND1 commonly receives the external power supply voltage VDD through two input terminals and logically combines them, i.e., the external power supply voltage VDD input through the two input terminals of the first NAND gate ND1. The second NAND gate ND2 logically combines the external power supply voltage VDD and the second output COMP_OUT2 of the digitalization unit 440. The third NAND gate ND3 logically combines the external power supply voltage VDD and the first output COMP_OUT1 of the digitalization unit 440. The latch unit 464 includes a plurality of latches, each of which latches the corresponding logic signal. The value latched in the latch unit 464 is refreshed in response to the slew rate control signal SR_LAT of a logic high level.

Table 1 shows the operation of the signal generation unit shown in FIG. 4.

TABLE 1

| VDD | COMP_OUT1 | COMP_OUT2 | EN[1] | EN[2] | EN[3] |
|---|---|---|---|---|---|
| Low | H | H | H | H | H |
| Middle | L | H | H | H | L |
| High | L | L | H | L | L |

The external power supply voltage VDD is classified into three levels, i.e., "Low", "Middle", and "High", according to resistance of the resistors and size of the NMOS transistors included in the slew rate sensing unit 420 and the digitalization unit 440. If the external power supply voltage VDD has a "Low" level, both the first and the second outputs COMP_OUT1 and COMP_OUT2 of the digitalization unit 440 have a logic high level. If the external power supply voltage VDD has "Middle" level, the first output COMP_OUT1 has a logic low level and the second output COMP_OUT2 has the logic high level. If the external power supply voltage VDD has "High" level, both the first and the second outputs COMP_OUT1 and COMP_OUT2 has the logic low level.

When the external power supply voltage VDD has a "Low" level, the first to the third slew rate compensation signals EN[1:3] are activated at a logic high level. When the external power supply voltage VDD has a "Middle" level, the first and the second slew rate compensation signals EN[1:2] are activated at the logic high level. When the external power supply voltage VDD has a "High" level, only the first slew rate compensation signal EN[1] is activated at the logic high level.

Figure 5:
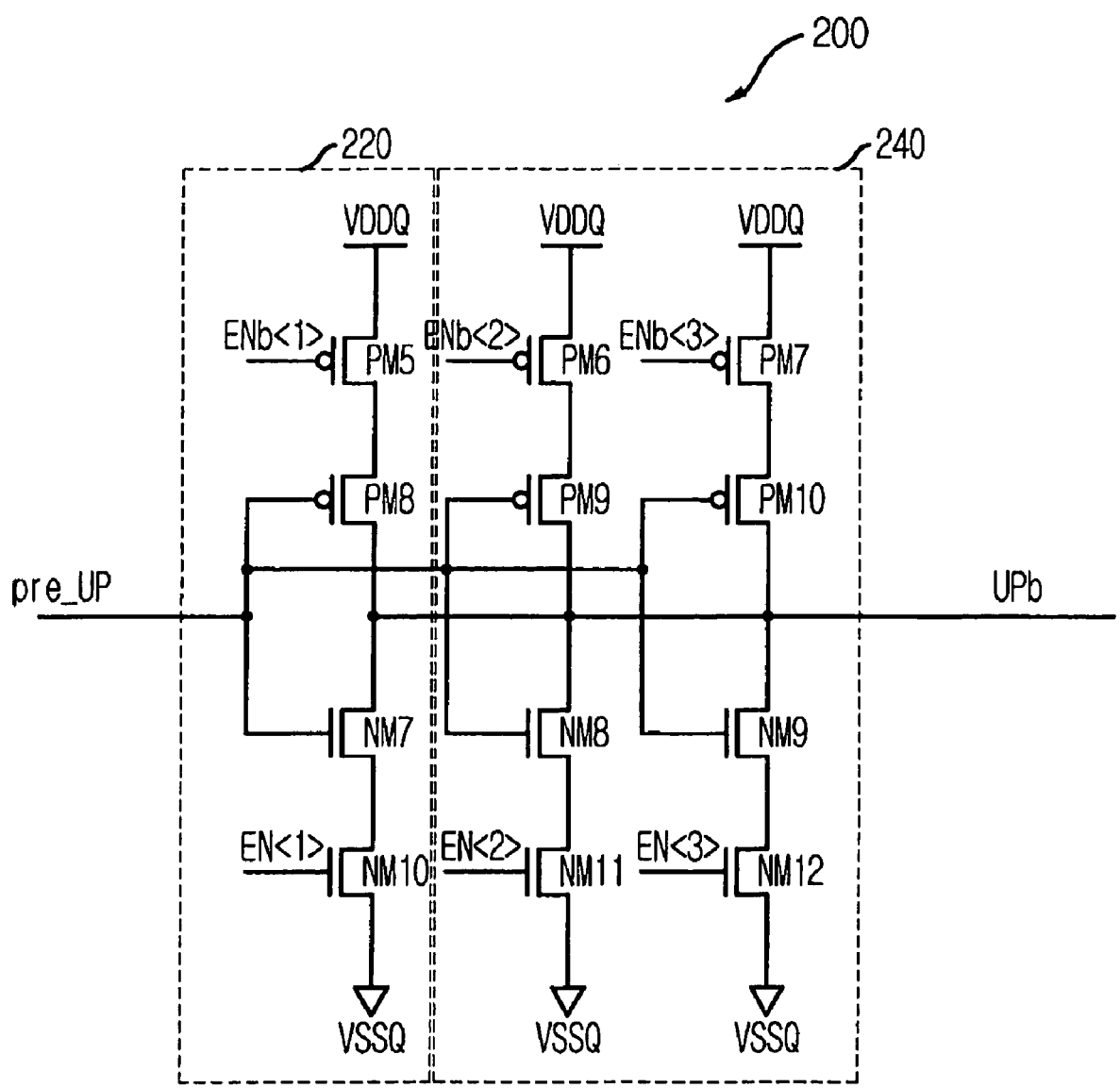
FIG. 5 is a schematic circuit diagram of a pull-up drive unit shown in FIG. 2.

FIG. 5 is a schematic circuit diagram describing the pull-up drive unit 200 shown in FIG. 2.

The pull-up drive unit 200 includes a main pull-up drive unit 220 and a supplementary pull-up drive unit 240. The main pull-up drive unit 220 includes a main pull-up drive inverter and a main drive voltage provider. The main pull-up drive inverter is provided with a seventh NMOS transistor NM7 and an eighth PMOS transistor PM8. The main drive voltage provider is provided with a fifth PMOS transistor PM5 and a tenth NMOS transistor NM10. The seventh NMOS transistor NM7 and the eighth PMOS transistor PM8 receives the pre-pull up drive signal pre_UP at their gates. The seventh NMOS transistor NM7 has the same characteristic as the fifth NMOS transistor NM5 included in the slew rate sensing unit 420. The fifth PMOS transistor PM5 and the tenth NMOS transistor NM10 respectively receive the first inverted slew rate compensation signal ENb[1] and the first slew rate compensation signal EN[1] at their gates. The fifth PMOS transistor PM5 is connected between the power supply voltage VDDQ terminal and the eighth PMOS transistor PM8. The tenth NMOS transistor NM10 is connected between the seventh NMOS transistor NM7 and the ground voltage VSSQ terminal.

The supplementary pull-up drive unit 240 includes supplementary pull-up drive inverters and supplementary drive voltage providers. The supplementary pull-up drive inverters include two PMOS transistors PM9 and PM10 and two NMOS transistors NM8 and NM9 respectively receiving the pre-pull up drive signal pre_UP at their gates. The supplementary drive voltage providers include two PMOS transistors PM6 and PM7 and two NMOS transistors NM11 and NM12. The sixth PMOS transistor PM6 and the eleventh NMOS transistor NM11 respectively receive the second inverted slew rate compensation signal ENb[2] and the second slew rate compensation signal EN[2] at their gates. The sixth PMOS transistor PM6 is connected between the power supply voltage VDDQ terminal and the ninth NMOS transistor NM9. The eleventh NMOS transistor NM11 is connected between the eighth NMOS transistor NM8 and the ground voltage VSSQ terminal. The seventh PMOS transistor PM7 and the twelfth NMOS transistor NM12 respectively receive the third inverted slew rate compensation signal ENb[3] and the third slew rate compensation signal EN[3] at their gates. The seventh PMOS transistor PM7 is connected between the power supply voltage VDDQ terminal and the tenth PMOS transistor PM10. The twelfth NMOS transistor NM12 is connected between the ninth NMOS transistor NM9 and the ground voltage VSSQ terminal. The pre-pull up drive unit 200 inverts the pre-pull up drive signal pre_UP to output the pull up drive signal UPb. The number of inverters which is turned on is determined by the slew rate compensation signal EN[1:3] and ENb[1:3] output from the slew rate compensation unit 400.

The pre-pull down drive unit 300 has similar circuitry as that of the pre-pull up drive unit 200 except that the pre-pull down drive unit 300 receives the pre-pull down drive signal pre_DNb to output the pull down drive signal DN. Therefore, a detailed description thereof will not be made in order to avoid redundancy.

When the level of the external power supply voltage VDD is low and the driving strength of the MOS transistor is small, i.e., when the slew rate is small, the number of enabled slew rate compensation signals EN[1:3] and ENb[1:3] output from the slew rate compensation unit 400 is increased. Accordingly, the number of inverters, included the pre-pull up drive unit 200 and the pre-pull down drive unit 300, which are turned on is increased. Therefore, a slew rate of an output signal of the output driver is increased. When the level of the external power supply voltage VDD is high and the driving strength of the MOS transistor is great, i.e., when the slew rate is large, the number of the enabled slew rate compensation signals EN[1:3] and ENb[1:3] output from the slew rate compensation unit 400 is decreased. Therefore, the number of inverters which are turned on is decreased. As a result, the slew rate of the output signal of the output driver is decreased. In this way, the slew rate of the output signal is stably adjusted to have a value in a predetermined range.

In the embodiment shown in FIG. 3, the slew rate compensation unit 400 includes the NMOS transistor NM5 in the slew rate sensing unit 420. However, in another embodiment, the slew rate sensing unit 420 may include a PMOS transistor that is the same as the PMOS transistors included in the pre-pull up drive unit 200 and the pre-pull down drive unit 300.

The output driver in accordance with the present invention appropriately adjusts the driving strength of the pre-pull up dive unit and the pre-pull down drive unit according to the changes of surrounding conditions, e.g., process, voltage, and temperature. Accordingly, the variation of the slew rate of the output signal stays within a predetermined range. As a result, the present invention improves the reliability of the output driver and signal integrity.

The present application contains subject matter related to Korean patent application No. 2005-091552 and No. 2005-123978, filed in the Korean Patent Office on Sep. 29, 2005 and on Dec. 15, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An output driver, comprising:
a pre-pull up drive unit configured to perform a pre-pull up drive operation;
a pre-pull down drive unit configured to perform a pre-pull down drive operation;
a drive unit configured to perform a drive operation in response to outputs of the pre-pull up drive unit and the pre-pull down drive unit; and
a compensation unit configured to sense changes of driving strengths of the pre-pull up drive unit and the pre-pull down drive unit to control the drive operations of the pre-pull up drive unit and the pre-pull down drive unit,
wherein the compensation unit includes:
a slew rate sensing unit configured to sense changes of the slew rate of the drive unit according to surrounding conditions;
a digitalization unit configured to digitalize an output of the slew rate sensing unit and to output the digitized output of the slew rate sensing unit; and
a signal generation unit configured to generate a plurality of the slew rate compensation signals according to an output of the slew rate sensing unit, wherein the digitized output of the slew rate sensing unit is inputted to the signal generation unit,
wherein the driving strengths of the pre-pull up drive unit and the pre-pull down drive unit are stabilized in response to slew rate compensation signals output from the compensation unit,
wherein the pre-pull up drive unit comprises;
a main pre-pull up drive unit configured to perform a main drive operation; and
a supplementary pre-pull up drive unit configured to adjust the driving strength of the pre-pull up drive unit,
wherein the pre-pull down drive unit comprises
a main pre-pull down drive unit configured to perform the main drive operation; and
a supplementary pre-pull down drive unit configured to adjust the driving strength of the pre-pull down drive unit,
wherein the slew rate sensing unit comprises a MOS transistor; and
the pre-pull up drive unit and the pre-pull down drive unit each comprise an MOS transistor.

2. The output driver as recited in claim 1, wherein the MOS transistors of the slew rate sensing unit, the pre-pull up drive unit, and pre-pull down drive unit are of the same configuration.

3. The output driver as recited in claim 2, wherein the slew rate sensing unit comprises a plurality of resistors connected between a first internal power supply voltage terminal and a ground voltage terminal in series and outputs an output signal through one of a plurality of connection nodes, wherein one of the plurality of the resistors is the MOS transistor, a gate thereof coupled to an external power supply voltage.

4. The output driver as recited in claim 3, wherein the slew rate sensing unit comprises: a first passive element resistor connected between the first internal power supply voltage terminal and a first output node; a first NMOS transistor, connected to the first output node, a gate of the first NMOS transistor having a gate coupled to an external power supply voltage; and a second NMOS transistor, connected between the first NMOS transistor and the ground voltage terminal, a gate of the second NMOS transistor coupled to a sense signal, wherein the sense signal enables the slew rate sensing unit only when attaining an appropriate threshold level whereby current consumption by the slew rate sensing unit is minimized.

5. The output driver as recited in claim 3, wherein the first NMOS transistor is of the same configuration as the transistors of the main pre-pull up drive unit and the main pre-pull down drive unit.

6. The output driver as recited in claim 5, wherein the digitalization unit includes: a reference voltage provider configured to provide a plurality of reference voltages; and a comparing unit configured to compare each of the reference voltages and the output of the slew rate sensing unit.

7. The output driver as recited in claim 6, wherein the reference voltage provider includes a plurality of resistors connected between the first internal power supply voltage terminal and the ground voltage terminal in series and voltages at connection nodes between the resistors provide the reference voltages.

8. The output driver as recited in claim 7, wherein the comparing unit includes a plurality of differential amplifiers are coupled to receive one of reference voltages and the output of the slew rate sensing unit.

9. The output driver as recited in claim 8, wherein the drive unit includes: a first PMOS transistor connected to a second internal power supply voltage terminal receiving an output of the pre-pull up drive unit at its gate; a second passive element resistor connected between the first PMOS transistor and a second output node; a third NMOS transistor connected to the ground voltage terminal receiving an output of the pre-pull down drive unit at its gate; and a third passive element resistor connected between the third NMOS transistor and the second output node.

10. The output driver as recited in claim 3, wherein the transistor of the slew rate sensing unit is a PMOS transistor.

11. The output driver as recited in claim 2, wherein the drive unit includes: a PMOS transistor connected to a power supply voltage terminal and receiving an output of the pre-pull up drive unit; a first passive element resistor connected between the PMOS transistor and an output node; an NMOS transistor connected to an internal ground voltage terminal and receiving an output of the pre-pull down drive unit; and a second passive element resister connected between the NMOS transistor and the output node.

12. The output driver as recited in claim 11, wherein the main pre-pull up drive unit includes: a main inverter unit configured to invert a first drive signal to thereby output a pull up drive signal; and a main drive voltage provider configured to selectively provide a drive voltage to the inverter unit in response to the plurality of the slew rate compensation signals.

13. The output driver as recited in claim 12, wherein the main inverter unit includes: a PMOS transistor receiving the first drive signal at its gate; and a NMOS transistor receiving the first drive signal at its gate.

14. The output driver as recited in claim 13, wherein the main drive voltage provider includes: a PMOS transistor receiving corresponding inverted slew rate compensation signal at its gate; and a NMOS transistor receiving corresponding slew rate compensation signal at its gate.

15. The output driver as recited in claim 14, wherein the supplementary pre-pull up drive unit includes: a supplementary inverter unit configured to invert a first drive signal to thereby output a pull up drive signal; and a supplementary drive voltage provider configured to selectively provide a drive voltage to the inverter unit in response to the plurality of the slew rate compensation signals.

16. The output driver as recited in claim 15, wherein the supplementary inverter unit includes: a plurality of PMOS transistors connected each other in parallel between the drive voltage provider and an output node, each PMOS transistor receiving the first drive signal at its gate; and a plurality of NMOS transistors connected each other in parallel between the output node and the drive voltage provider, each NMOS transistor receiving the first drive signal.

17. The output driver as recited in claim 16, wherein the supplementary drive voltage provider includes: a plurality of PMOS transistors connected between the power supply voltage terminal and the plurality of the PMOS transistors included in the inverter unit, each PMOS transistor receiving corresponding inverted slew rate compensation signal at its gate; and a plurality of NMOS transistors connected between the plurality of the NMOS transistors included in the inverter unit, each NMOS transistor receiving corresponding slew rate compensation signal at its gate.

18. An output driver, comprising:
a compensation unit configured to sense a variation of a slew rate of the output driver to thereby generate a plurality of slew rate compensation signals;
a pre-pull up drive unit configured to perform a pre-pull up operation in response to the plurality of the slew rate compensation signals;
a pre-pull down drive unit configured to perform a pre-pull down operation in response to the plurality of the slew rate compensation signals; and
a drive unit configured to drive an output signal in response to outputs of the pre-pull up drive unit and the pre-pull down drive unit,
wherein the compensation unit includes:
a slew rate sensing unit configured to sense the variation of the slew rate of the output driver according to surrounding conditions such as pressure, volume, and temperature;
a digitalization unit configured to digitalize and input to the signal generation unit the output of the slew rate sensing unit; and
a signal generation unit configured to generate a plurality of the slew rate compensation signals according to an output of the slew rate sensing unit,
wherein the slew rate sensing unit, the pre-pull up drive unit and the pre-pull down drive unit each includes a MOS transistor of similar configuration.

19. The output driver as recited in claim 18, wherein the pre-pull up drive unit includes: an inverter unit configured to invert a first drive signal to thereby output as a pull up drive signal; and a drive voltage provider configured to selectively provide a drive voltage to the inverter unit in response to the plurality of the slew rate compensation signals.

20. The output driver as recited in claim 19, wherein the inverter unit includes: a plurality of PMOS transistors connected to each other in parallel between the drive voltage provider and an output node, each PMOS transistor receiving the first drive signal at its gate; and a plurality of NMOS transistors connected each other in parallel between the output node and the drive voltage provider, each NMOS transistor receiving the first drive signal.

21. The output driver as recited in claim 20, wherein the drive voltage provider includes: a plurality of PMOS transistors connected between a first internal power supply voltage terminal and the plurality of the PMOS transistors included in the inverter unit, each PMOS transistor receiving a corresponding slew rate compensation signal at its gate; and a plurality of NMOS transistors connected between the plurality of the NMOS transistors included in the inverter unit and a ground voltage terminal, each NMOS transistor receiving a corresponding slew rate compensation signal at its gate.

22. The output driver as recited in claim 21, wherein the slew rate sensing unit is implemented with a plurality of resistors connected between a second internal power supply voltage terminal and a ground voltage terminal in series and outputs an output signal through one of the connection nodes, wherein one of the plurality of the resistors is the MOS transistor, receiving an external power supply voltage at its gate.

23. The output driver as recited in claim 22, wherein the slew rate sensing unit includes: a first passive element resistor connected between the second internal power supply voltage terminal and a first output node; a first NMOS transistor, connected to the first output node, receiving an external power supply voltage through its gate; and a second NMOS transistor, connected between the first NMOS transistor and the ground voltage terminal, receiving a sense signal, wherein the sense signal enables the slew rate sensing unit only when the sense signal attains an appropriate threshold order to save current consumption by the slew rate sensing unit.

24. The output driver as recited in claim 23, wherein the first NMOS transistor is same as transistors included in the pre-pull up drive unit and the pre-pull down drive unit.

25. The output driver as recited in claim 22, wherein the slew rate sensing unit, the pre-pull up drive unit and the pre-pull down drive unit each comprise a PMOS transistor.

26. The output driver as recited in claim 25, wherein the digitalization unit includes: a reference voltage provider configured to provide a plurality of reference voltages; and a comparing unit configured to compare each of the reference voltages and the output of the slew rate sensing unit.

27. The output driver as recited in claim 26, wherein the reference voltage provider includes a plurality of resistors connected between the second internal power supply voltage terminal and the ground voltage terminal in series and voltages at connection nodes between the resistors provide the reference voltages.

28. The output driver as recited in claim 27, wherein the comparing unit includes a plurality of differential amplifiers receiving one of reference voltages and the output of the slew rate sensing unit.

29. The output driver as recited in claim 28, wherein the drive unit includes: a first PMOS transistor connected to a second internal power supply voltage terminal receiving an output of the pre-pull up drive unit at its gate; a second resistor of passive element connected between the first PMOS transistor and a second output node; a third NMOS transistor connected to the ground voltage terminal receiving an output of the pre-pull down drive unit at its gate; and a third resistor of passive element connected between the third NMOS transistor and the second output node.

30. The output driver as recited in claim 29, wherein the drive unit includes: a PMOS transistor connected to an internal power supply voltage terminal receiving an output of the pre-pull up drive unit; a first resistor of passive element connected between the PMOS transistor and an output node; an NMOS transistor connected to a ground voltage terminal receiving an output of the pre-pull down drive unit; and a second resister of passive element connected between the NMOS transistor and the output node.

* * * * *